US011604755B2

United States Patent
Balachandran et al.

(10) Patent No.: US 11,604,755 B2
(45) Date of Patent: Mar. 14, 2023

(54) PROCESSOR SOCKET BRIDGE FOR INPUT/OUTPUT EXTENSION

(71) Applicant: Cisco Technology, Inc., San Jose, CA (US)

(72) Inventors: Jayaprakash Balachandran, Fremont, CA (US); Bidyut Kanti Sen, Milpitas, CA (US); Kenny Lieu, Milpitas, CA (US); Dattatri N. Mattur, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/196,124

(22) Filed: Mar. 9, 2021

(65) Prior Publication Data

US 2022/0292041 A1    Sep. 15, 2022

(51) Int. Cl.
  *G06F 13/40*  (2006.01)
  *G06F 3/12*  (2006.01)
  *H05K 7/10*  (2006.01)

(52) U.S. Cl.
  CPC ........ *G06F 13/4068* (2013.01); *G06F 13/409* (2013.01); *H05K 7/10* (2013.01)

(58) Field of Classification Search
  None
  See application file for complete search history.

(56) References Cited

U.S. PATENT DOCUMENTS

| | | | | |
|---|---|---|---|---|
| 5,953,502 A * | 9/1999 | Helbig, Sr. | ........... | G06F 9/3879 714/36 |
| 6,173,419 B1 * | 1/2001 | Barnett | ............... | G06F 11/3652 714/28 |
| 10,747,702 B2 | 8/2020 | Stuewe et al. | | |
| 2002/0166062 A1 * | 11/2002 | Helbig, Sr. | ........... | G06F 21/575 726/22 |
| 2004/0268000 A1 * | 12/2004 | Barker | .................... | H05K 3/222 710/301 |
| 2006/0291180 A1 * | 12/2006 | Yang | ....................... | G06F 1/185 361/803 |
| 2007/0162678 A1 * | 7/2007 | Yang | ................... | G06F 13/4027 710/306 |
| 2011/0296075 A1 | 12/2011 | Kuan et al. | | |

(Continued)

OTHER PUBLICATIONS

HPE, "Rack Mount Servers—ProLiant & Integrity", retrieved from Internet May 2, 2022, 10 pages; https://www.hpe.com/us/en/servers/rack.html.

(Continued)

*Primary Examiner* — Hyun Nam
(74) *Attorney, Agent, or Firm* — Edell, Shapiro & Finnan, LLC

(57) ABSTRACT

Presented herein are improvement to computer system architecture. In one embodiment, a method includes reconfiguring system interconnect links disposed between a first central processing unit socket and a second central processing unit socket, disposed together on a single motherboard, as peripheral bus links; and transmitting electrical signals, via the peripheral bus links, and via a printed circuit board that bridges the second central processing unit socket, to at least one input/output functional block that is disposed on the single motherboard and that is selectively connectable to the second central processing unit socket.

20 Claims, 9 Drawing Sheets

(56) References Cited

U.S. PATENT DOCUMENTS

| | | |
|---|---|---|
| 2015/0016044 A1 | 1/2015 | Ping |
| 2015/0134868 A1* | 5/2015 | Shaeffer .............. G06F 13/4063 |
| | | 710/300 |
| 2016/0026589 A1* | 1/2016 | Kolor .................. G06F 13/4221 |
| | | 710/316 |
| 2016/0147694 A1* | 5/2016 | Norton ................ G06F 13/4068 |
| | | 710/306 |
| 2017/0010628 A1 | 1/2017 | Byers |
| 2020/0133907 A1 | 4/2020 | Stuewe et al. |
| 2020/0285292 A1* | 9/2020 | Seiler ...................... G06F 1/184 |

OTHER PUBLICATIONS

Charlie Demerjian, "How is Intel pricing Cascade Lake", SemiAccurate, Apr. 15, 2019, 7 pages; https://semiaccurate.com/2019/04/15/how-is-intel-pricing-cascade-lake/.

Robert W Hormuth, "Why Single-Socket Servers Could Rule the Future", The Next Platform, Apr. 24, 2019, 13 pages.

* cited by examiner

PROCESSOR SOCKET BRIDGE FOR INPUT/OUTPUT EXTENSION

TECHNICAL FIELD

The present disclosure relates to multi-processor computer system architectures.

BACKGROUND

The progression of computer technology has included server motherboards having one central processing unit (CPU) socket ("1S" systems), two CPU sockets ("2S" systems), and four CPU sockets ("4S" systems), among other still more sophisticated architectures. Generally speaking, multi-socket designs provide higher computing power and potentially higher bandwidth. Traditionally, 2S systems are more common in the datacenter market than are, e.g., 4S systems. Recently, CPU manufacturers have begun marketing CPUs with multiple cores, even hundreds of cores per CPU. Hence, for many applications, a 1S system or server might be more than sufficient to support an end user's needs. On the other hand, there will still likely be demand for 2S systems or servers, especially for high end applications. In situations where a 1S system server is adequate, an end user who has deployed a 2S system might simply choose to install only one CPU (i.e., populate only one socket) of the 2S system. Unfortunately, in such a use scenario, peripheral component interconnect express (PCIe) input/output (IO) devices, for example, that are connected to a second socket of the 2S system are left unused. As a result, the overall available server IO resources are diminished resulting in inefficient use of the overall 2S system motherboard.

DESCRIPTION OF EXAMPLE EMBODIMENTS

Overview

Presented herein are techniques to enable a first CPU in a two CPU socket system motherboard to take advantage of IO functional blocks associated with a second, unused, CPU socket. A method may include reconfiguring system interconnect links disposed between a first central processing unit socket and a second central processing unit socket, disposed together on a single motherboard, as peripheral bus links, and transmitting electrical signals, via the peripheral bus links, and via a printed circuit board that bridges the second central processing unit socket, to at least one input/output functional block that is disposed on the single motherboard and that is selectively connectable to the second central processing unit socket.

In another embodiment, an apparatus is provided. The apparatus may include a motherboard, a first central processing unit socket mounted on the motherboard, a second central processing unit socket mounted on the motherboard, a first connector in communication with the first central processing unit socket, a second connector in communication with at least one input/output functional block that is disposed on the motherboard and that is configured to support a second central processing unit deployable in the second central processing unit socket, and a mezzanine printed circuit board that electrically connects the first central processing unit socket with the at least one input/output functional block via the first connector and the second connector.

Example Embodiments

Figure 1:
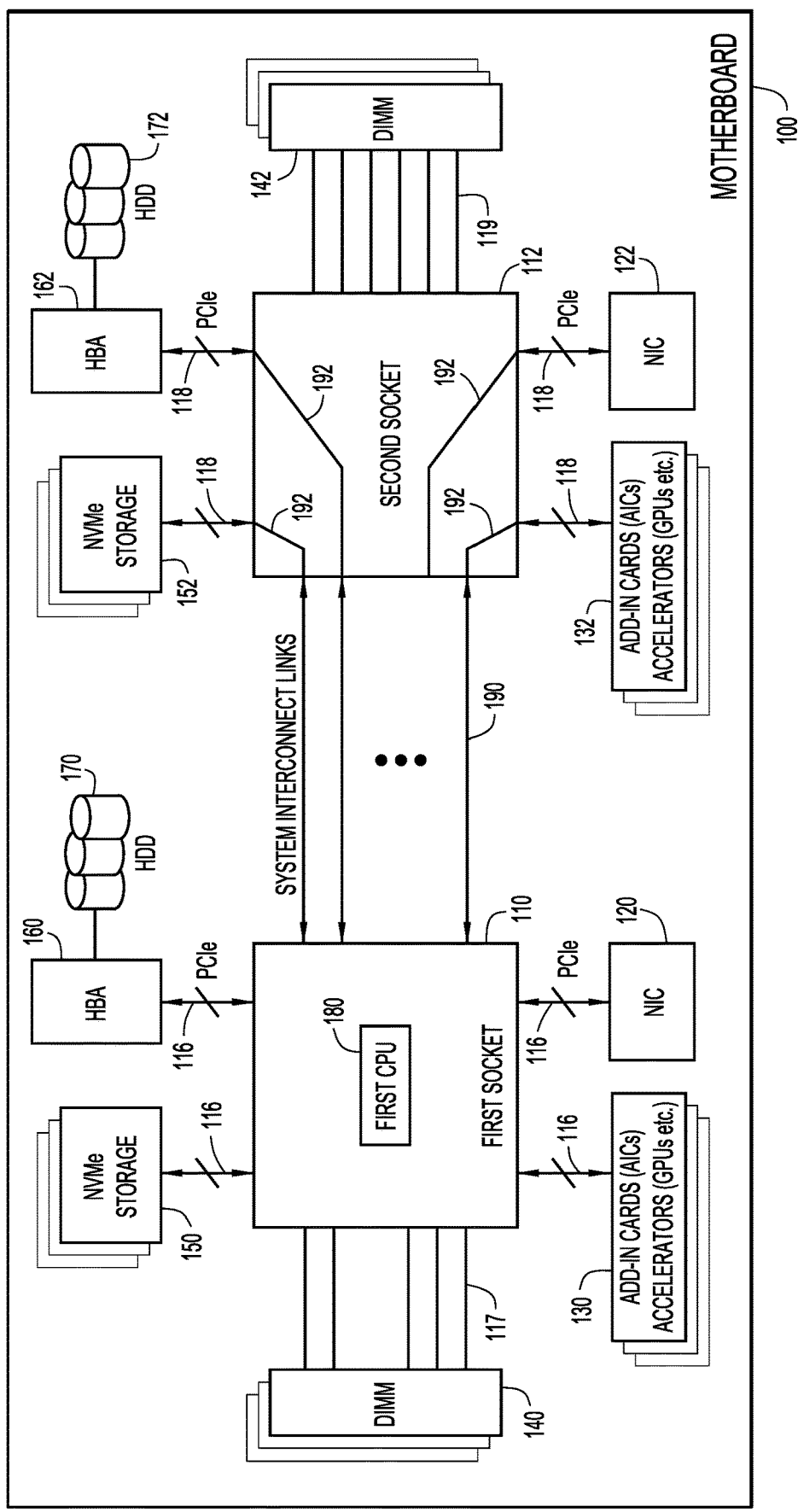
FIG. 1 shows a 2S system motherboard with only one socket populated with a CPU, according to an example embodiment.

FIG. 1 shows a 2S system motherboard 100 with only one socket populated with a CPU, according to an example embodiment. As shown, motherboard 100 includes a first socket 110 that is connected to a plurality of IO devices or functional blocks via a PCIe bus 116 and/or separate, e.g., memory bus 117. The IO devices or functional blocks include, e.g., a network interface card (NIC) 120, add-in cards (AICs) 130, e.g., accelerators (including graphical processing units (GPUs)), dual inline memory modules (DIMMs) 140, non-volatile memory express (NVMe) storage 150, host bus adaptor (HBA) 160, and hard disk drive (HDD) 170. A first CPU 180 is disposed in first socket 110.

In the 2S system of FIG. 1, a second socket 112 is connected to a plurality of IO devices or functional blocks via a PCIe bus 118 and/or separate, e.g., memory bus 119. The IO devices or functional blocks include, e.g., NIC 122, AICs 132, DIMMs 142, NVMe storage 152, HBA 162, and HDD 172. In this case, a CPU is not disposed in second socket 112.

First socket 110 and second socket 112 are in communication with one another via a system interconnect links 190, which can be implemented as, e.g., cache coherent non-uniform memory access (NUMA) links developed by Silicon Graphics, Inc., UltraPath Interconnect (UPI) links in the case of Intel, or inter-chip global memory interconnect (xGMI) links in the case of AMD. Note that the physical traces of system interconnect links 190 can be configured also as PCIe IO links. For single CPU operation in a 2S system configuration, and in accordance with an example embodiment, the system interconnect links 190 are configured as PCIe IO links and are connected, conceptually, as shown by traces 192 to NIC 122, AICs 132, DIMMs 142, NVMe storage 152, HBA 162, and/or HDD 172, thus giving access to those IO devices to first CPU 180 disposed in first socket 110.

Figure 2:
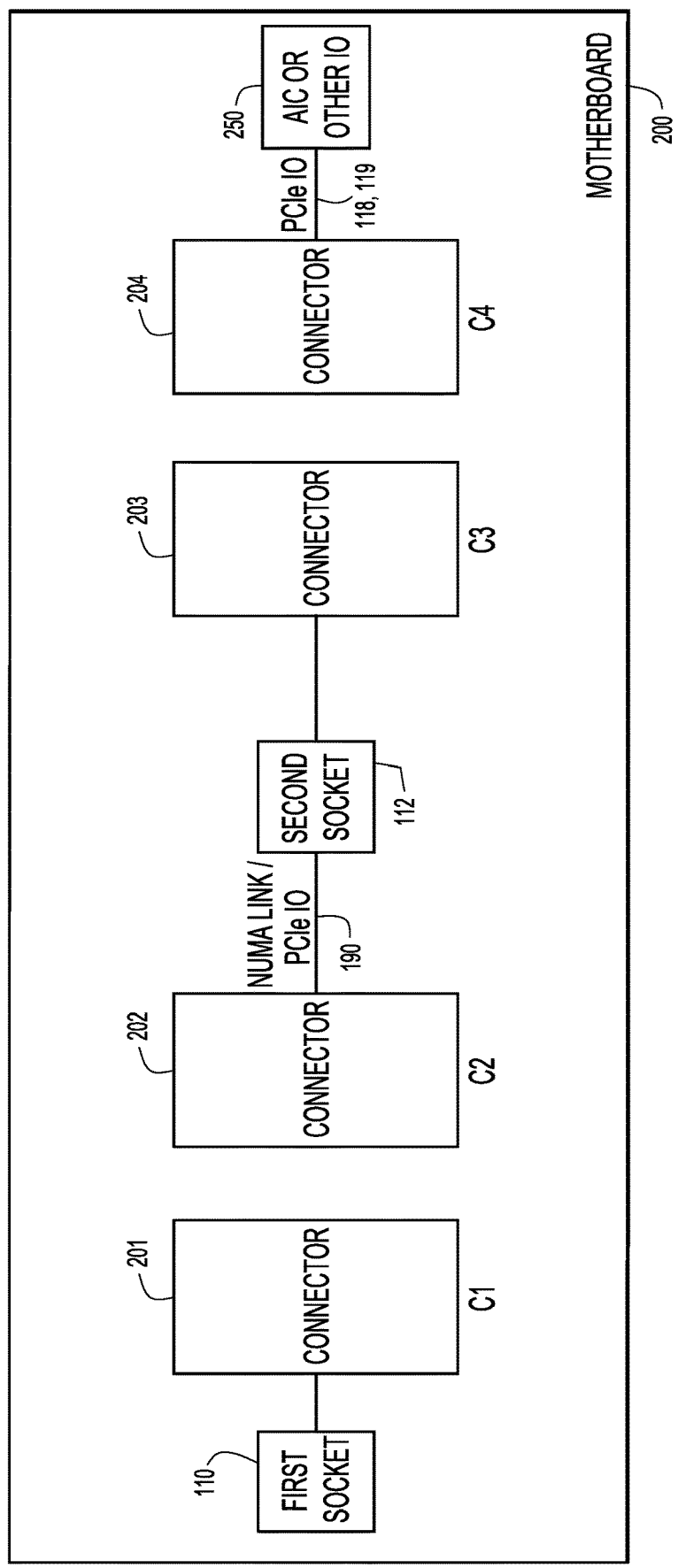
FIG. 2 shows connectors deployed on a 2S system motherboard to enable operation with either one CPU or two CPUs, according to an example embodiment.

FIG. 2 shows connectors deployed on a 2S system motherboard 200 to enable operation with either one CPU or two CPUs, according to an example embodiment. Specifically, compared to motherboard 100, motherboard 200 is configured as follows. System interconnect links 190 are effectively "cut" and the cut ends thereof are terminated at connector C1 201 and connector C2 202, respectively. Likewise, PCIe bus 118 and memory bus 119 are "cut" and the cut ends thereof are terminated at connector C3 203 and connector C4 204, respectively. Connector C4 204 is in communication with AIC or other IO 250, which could be any of, e.g., NIC 122, AICs 132 (e.g., GPUs), DIMMs 142, NVMe storage 152, HBA 162, and/or HDD 172. With the connectors C1 201, C2 202, C3 203, and C4 204 in place as depicted, it is possible to operate motherboard 200 with two CPUs or with a single CPU, wherein, in single-CPU operation, the single CPU will have access to the AIC or other IO 250 associated with second socket 112 (which would not be populated with a second CPU in such a scenario).

Figure 3:
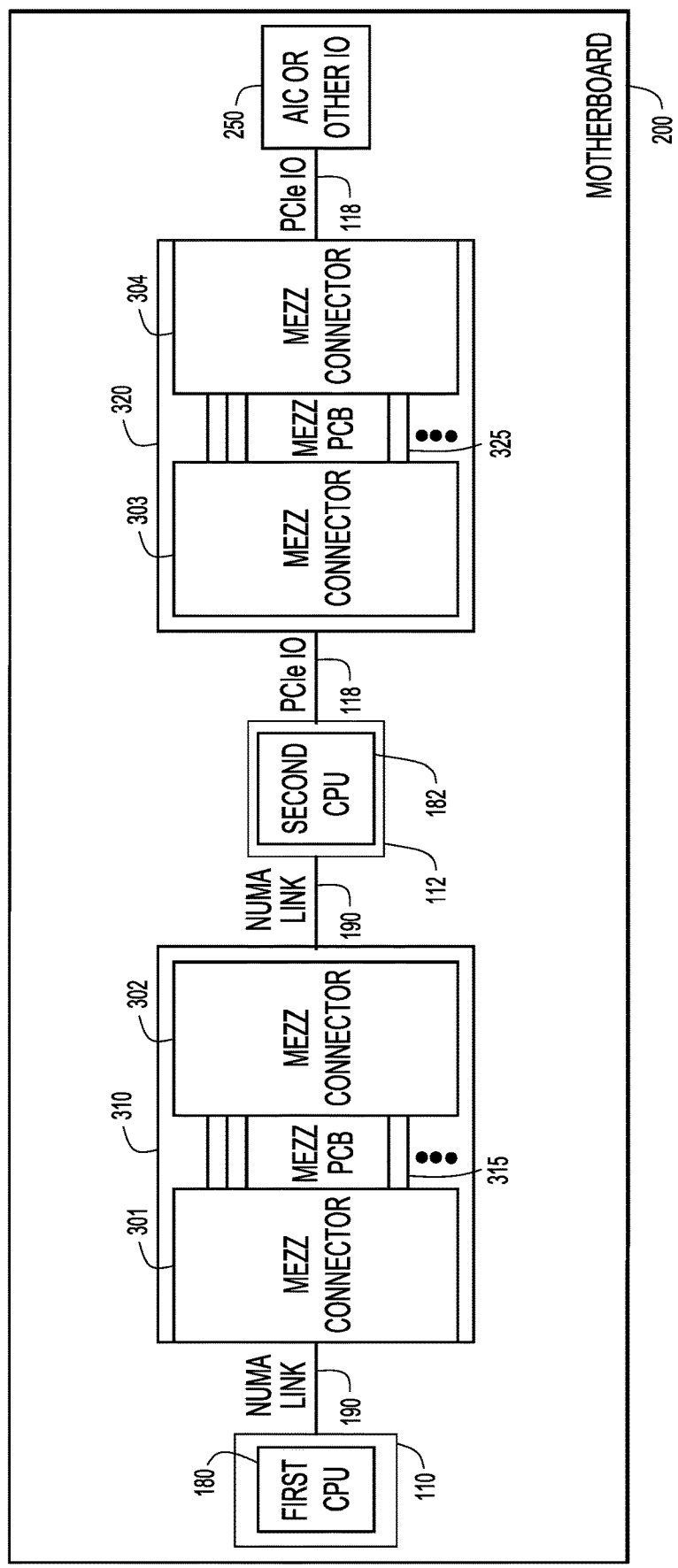
FIG. 3 shows the deployment of two mezzanine printed circuit boards (PCBs) to configure the 2S system motherboard for operation with two CPUs, according to an example embodiment.

FIG. 3 shows the deployment of two mezzanine printed circuit boards (PCBs) 310, 320 that are used to configure the 2S system motherboard 200 for operation with two CPUs, according to an example embodiment. To operate motherboard 200 with two CPUs, mezzanine PCB 310 is configured to reconnect the "cut" system interconnect links 190 between first CPU 180 and second CPU 182 using traces 315 that terminate at mezzanine connectors 301, 302, which correspond to and fit into connectors 201, 202 on motherboard 200. Further, mezzanine PCB 320 is configured to reconnect "cut" PCIe bus 118 between second CPU 182 and AIC or other IO 250 using traces 325 that terminate at mezzanine connectors 303, 304, which correspond to and fit into connectors 203, 204 on motherboard 200. With mezzanine PCBs 310 and 320 mounted in connectors 201, 202, 203, 204 as shown, first CPU 180 can communicate with second CPU 182 via a re-established system interconnect links 190 (operating as, e.g., NUMA links), and second CPU 182 can access AIC or other IO 250 via, e.g., PCIe bus 118.

Figure 4:
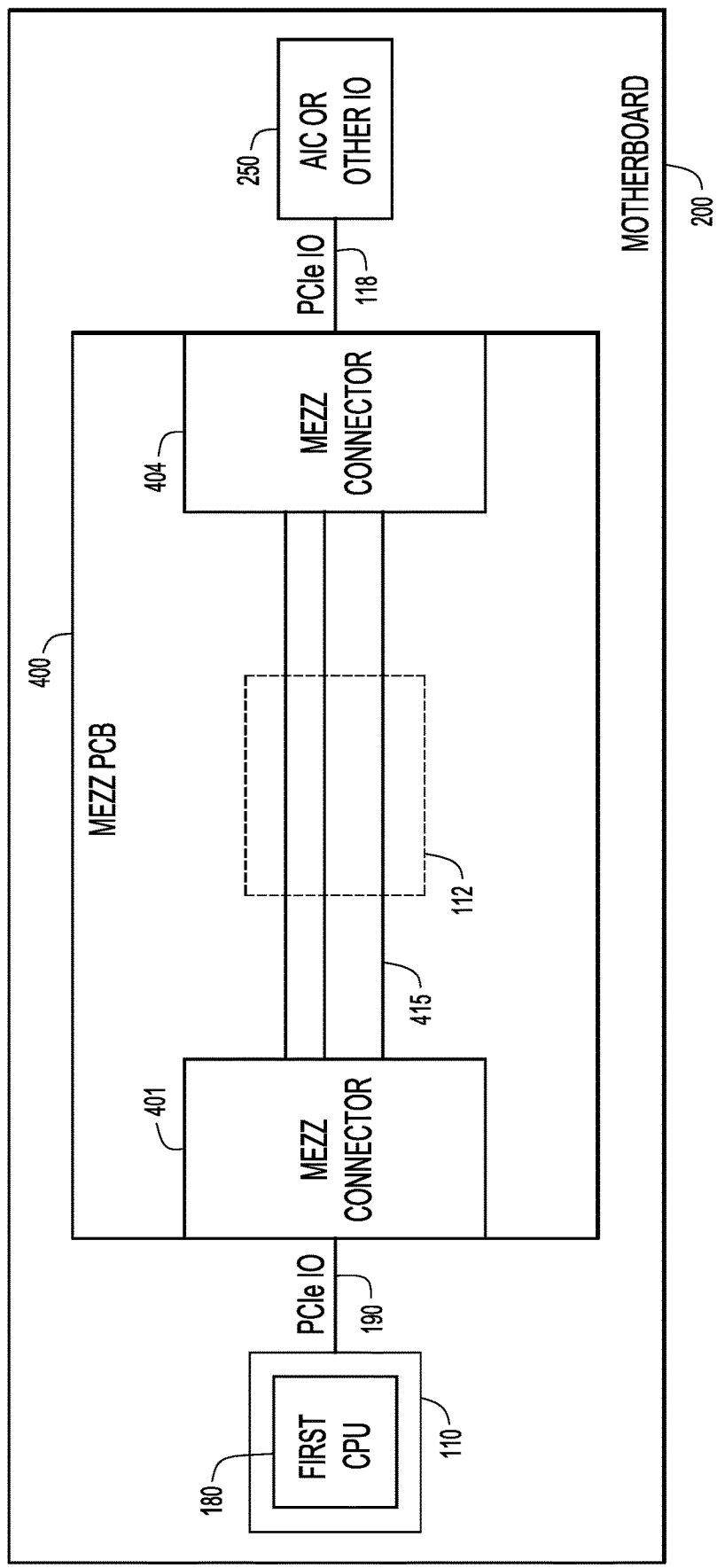
FIG. 4 shows the deployment a single mezzanine PCB to configure the 2S system motherboard for operation with a single CPU, wherein a first CPU of the 2S system motherboard has connectivity to the IO devices or functions connected to a second socket of the 2S system motherboard, according to an example embodiment.

FIG. 4 shows the deployment a mezzanine PCB 400 to configure the 2S system motherboard 200 for operation with a single CPU, wherein the first CPU of the 2S system motherboard has connectivity to the IO devices or functions connected to a second socket of the 2S system motherboard, according to an example embodiment. As shown, mezzanine PCB 400 includes mezzanine connectors 401, 404 that correspond to and fit into connectors 201, 204 on motherboard 200. In this case, traces 415 extend on mezzanine PCB 400 between mezzanine connector 401 and mezzanine connector 404. In one embodiment, mezzanine PCB extends or physically bridges over second socket 112 (which is not populated with a CPU). Mezzanine connectors 401, 404 and traces 415 thus connect first CPU 180 to the AIC or other IO 250 that would otherwise be connected to second socket 112. In this configuration, system interconnect links 190 are configured as PCIe IO to connect with PCIe bus 118 that is associated with second socket 112. If system constraints permit, connector C1 201 and connector C4 on motherboard 200 can be connected using, e.g., twin-axial cable or equivalent copper cables. That is, in some possible scenarios, mezzanine PCB 400 can be replaced with appropriate (e.g., ribbon) cables.

Figure 5:
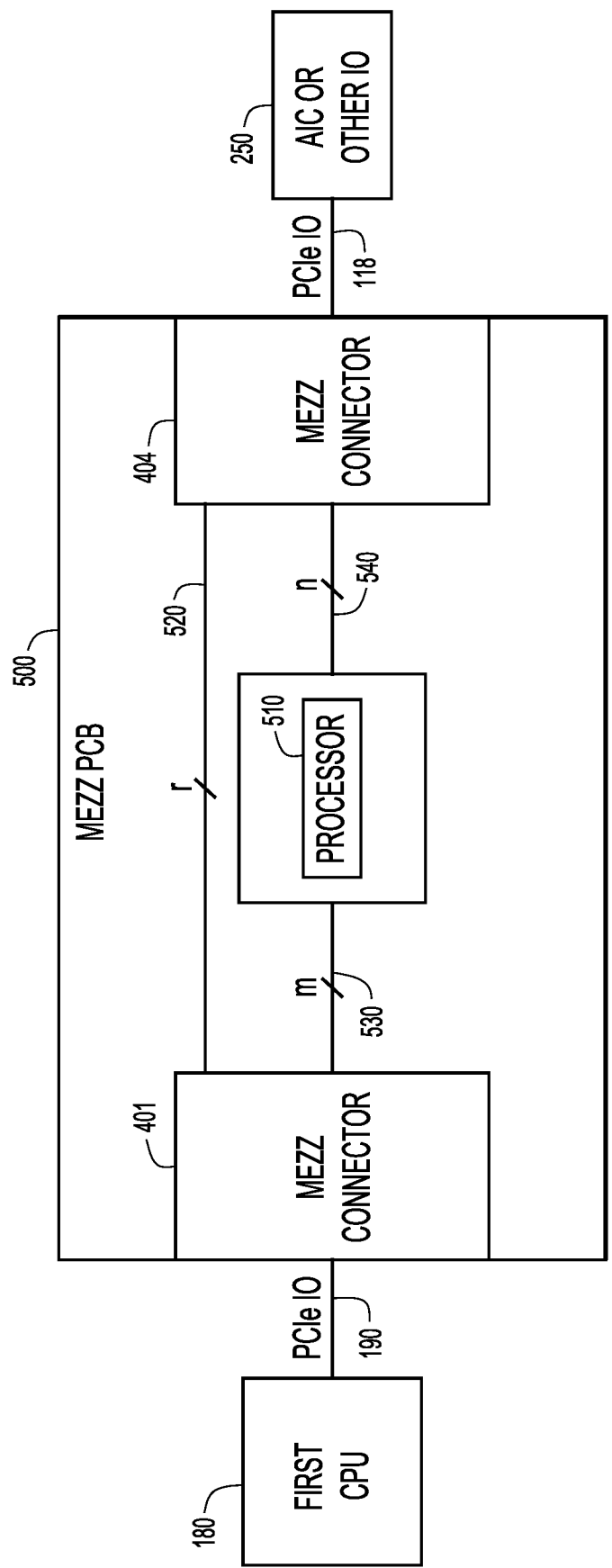
FIG. 5 shows a single mezzanine PCB including a processor to provide additional functionality, according to an example embodiment.

FIG. 5 shows a mezzanine PCB 500 including a processor 510 to provide additional functionality, according to an example embodiment. To simplify the figures, in FIGS. 5 (and 6) the motherboard 200 and sockets 110, 112 are not shown. Mezzanine PCB 500 is configured, like mezzanine PCB 400, to extend or physically bridge over second socket 112 (not shown) to connect first CPU 180 to the AIC or other IO 250 that would otherwise be connected to second socket 112. In order to meet PCIe signal integrity and compliance requirements, re-timer or re-driver devices, implemented by a processor 510 (e.g., an FPGA or ASIC), may be disposed on mezzanine PCB 500. Processor 510 can also be configured to offload some of the intensive IO tasks from first CPU 180. As shown, a bus comprising traces 520, 530, 540 may include 'r' number of PCIe ports connected directly between mezzanine connector 401 and mezzanine connector 404. The bus may also include 'm' PCIe ports connected to processor 510, and 'n' PCIe ports connected to AIC or other IO 250 from the processor 510. In this case, traces 520 may be operable as PCIe bus traces without any additional re-driving or re-timing, whereas traces 530, 540 may take advantage of re-timing and/or re-driving provided by processor 510. Re-timing and/or re-driving may help to address jitter issues and/or increases the amplitude of electrical signals carried by traces 'm' 530 and/or 'n' 540. Those skilled in the art will appreciate that processor 510 may be deployed as one or more different processors to perform different functions. Also, traces 'm' 530 may equal the number of traces 'n' 540, but that need not be the case. Further, there may be zero traces 'r' 520. Processor 510 may also be used to implement one or more smart or virtual NICs or storage offload processing. Notably, first CPU 180 can gain access to the AIC or other IO 250 associated with second socket 112 of motherboard 200.

Figure 6:
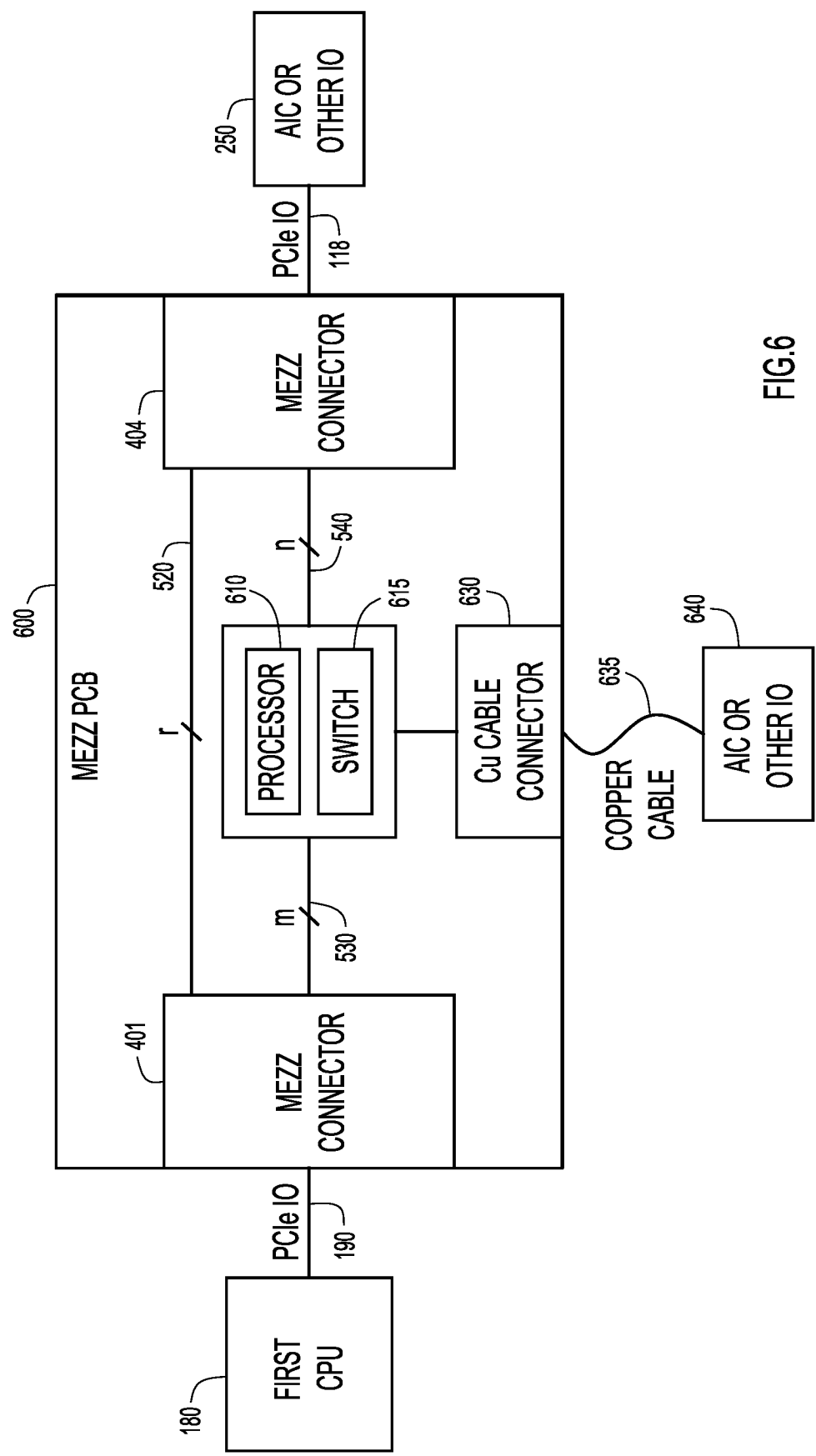
FIG. 6 shows a single mezzanine PCB provided with a processor to provide additional functionality, along with independent access to other IO devices, according to an example embodiment.

FIG. 6 shows a mezzanine PCB 600 provided with a processor 610 and a switch 615 to provide additional functionality, along with independent access to other IO devices, according to an example embodiment. As shown, mezzanine PCB 600 is also configured, like mezzanine PCB 400 and mezzanine PCB 500, to extend or physically bridge over second socket 112 (not shown) to connect first CPU 180 to the AIC or other IO 250 that would otherwise be connected to second socket 112. In order to meet PCIe signal integrity and compliance requirements, re-timer and/or re-driver devices, implemented by processor 610 (e.g., an FPGA or ASIC), may be disposed on mezzanine PCB 600. In the case of the embodiment of FIG. 6, a switch 615 can also further be configured to switch data or signaling to, e.g., a copper cable connector 630, and then via a copper cable 635 (or other connecting system), to AIC or other IO 640, which could be disposed on a board different from motherboard 200.

Power for mezzanine PCBs 500 and 600 to support processor 510, processor 610 and/or switch 615 may be supplied via either or both connector C1 201 and connector C4 204.

Figure 7:
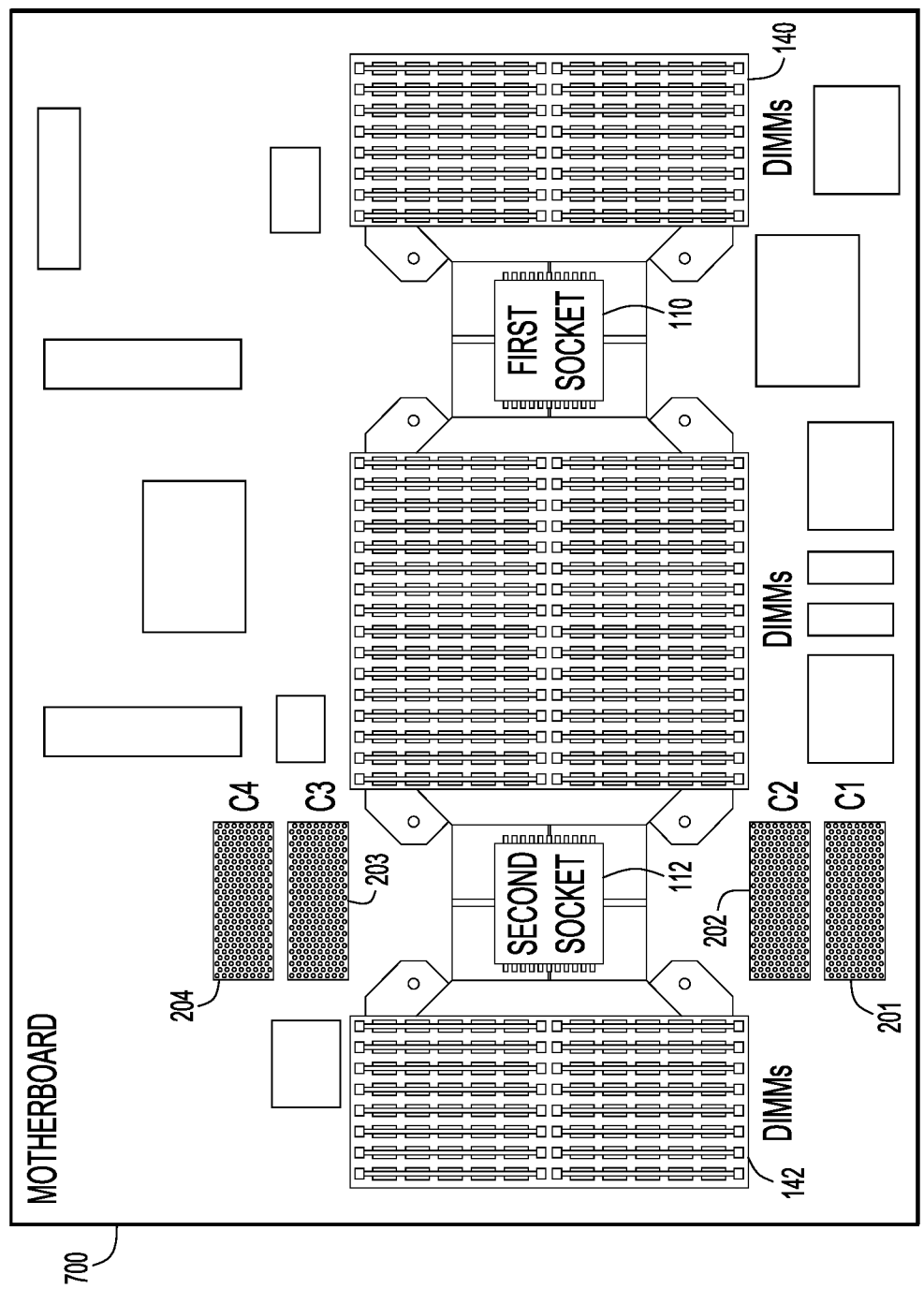
FIG. 7 is a plan view of a 2S system motherboard showing the connectors into which the mezzanine PCBs may be inserted, according to an example embodiment.

FIG. 7 is a plan view of a 2S system motherboard 700 (similar to motherboard 200) showing connector C1 201, connector C2 202, connector C3 203, and connector C4 204 into which the mezzanine PCBs 310, 320, 400, 500, or 600 may be inserted, according to an example embodiment. Thus, FIG. 7 shows more clearly how mezzanine PCBs 310, 320 would be disposed on either side of second socket 112, whereas mezzanine PCBs 400, 500, or 600 would physically extend or bridge over second socket 112 and span a distance between connector C1 201 and connector C4 204.

Figure 8:
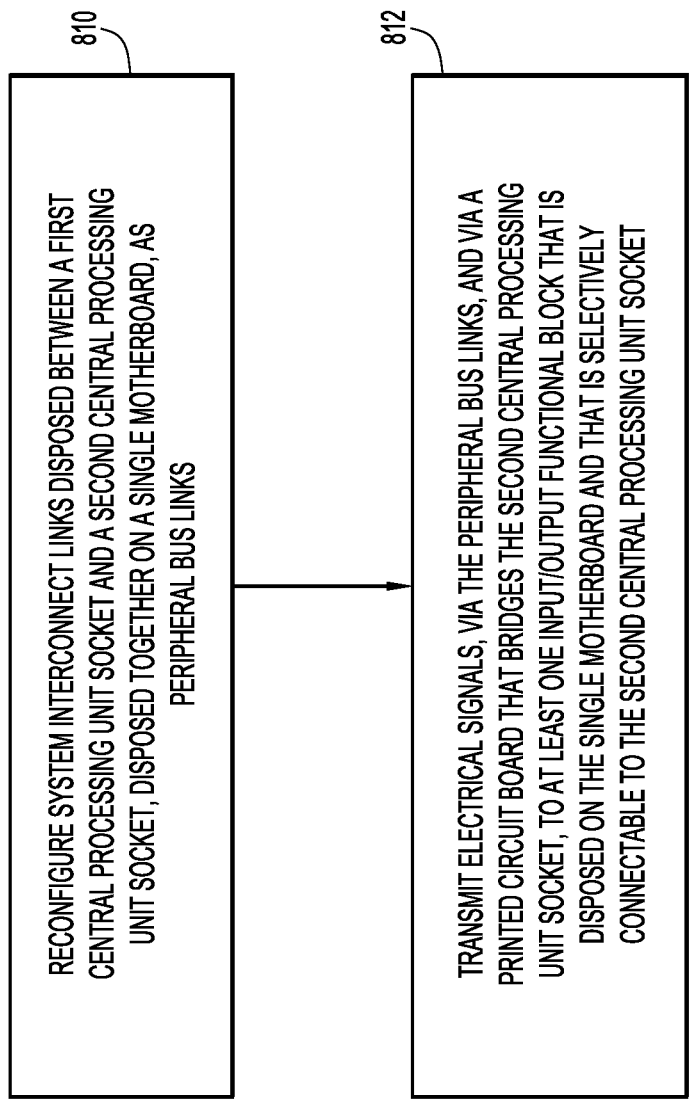
FIG. 8 is a flowchart depicting a series of operations for enabling a first CPU of the 2S system motherboard to connect to the IO devices or functions connected to a second socket of the 2S system motherboard, according to an example embodiment.

FIG. 8 is a flowchart depicting a series of operations for enabling a first CPU of the 2S system motherboard to connect to the IO devices or functions connected to a second socket of the 2S system motherboard, according to an example embodiment. At 810, an operation is configured to reconfigure system interconnect links disposed between a first central processing unit socket and a second central processing unit socket, disposed together on a single motherboard, as peripheral bus links. And, at 812, an operation is configured to transmit electrical signals, via the peripheral bus links, and via a printed circuit board that bridges the second central processing unit socket, to at least one input/output functional block that is disposed on the single motherboard and that is selectively connectable to the second central processing unit socket.

Figure 9:
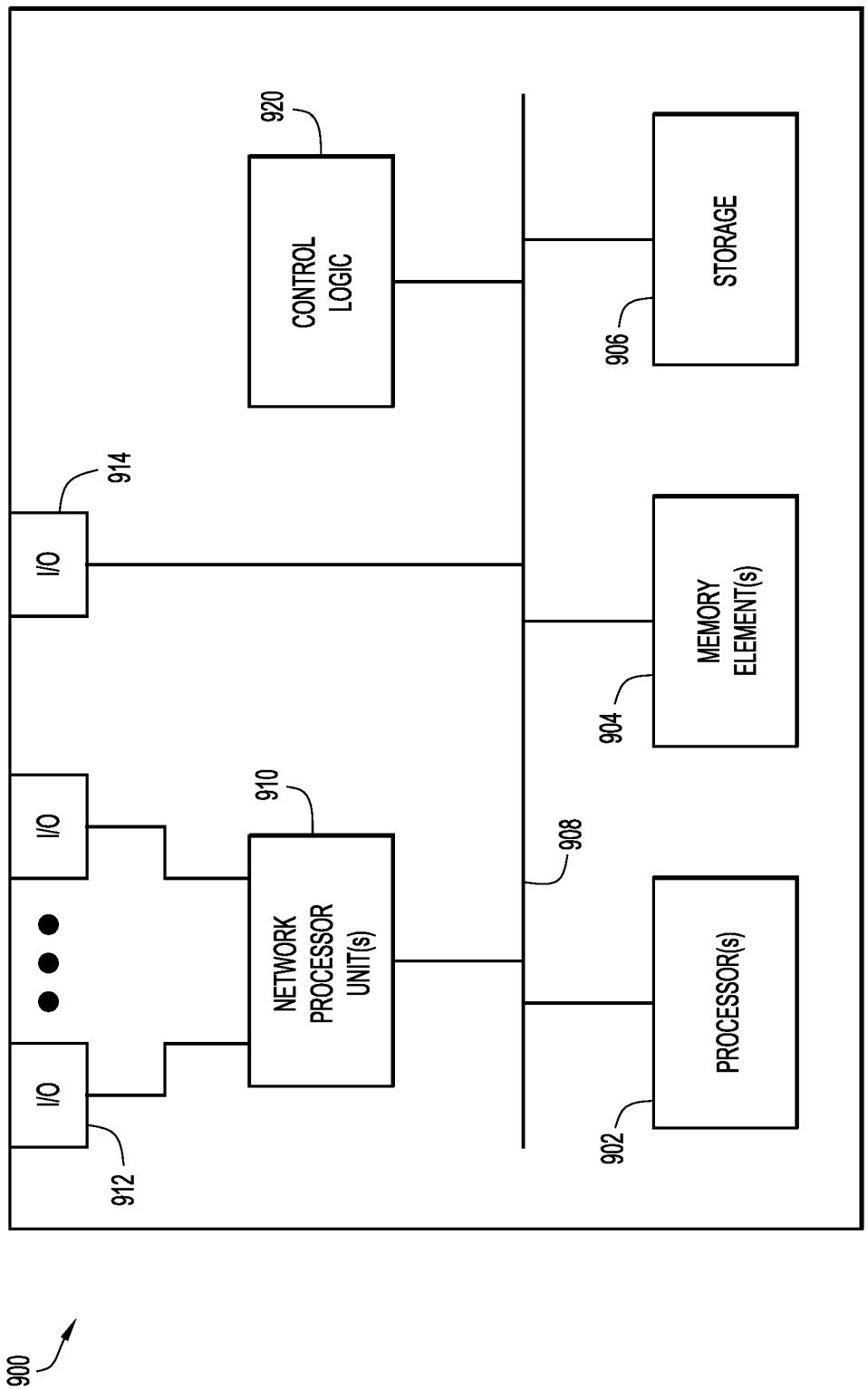
FIG. 9 illustrates a hardware block diagram of a computing device that might incorporate the 2S system motherboard, according to an example embodiment.

FIG. 9 illustrates a hardware block diagram of a computing device 900 that might incorporate motherboard 200 and perform functions associated with operations discussed herein in connection with the techniques disclosed in association with FIGS. 1-8.

In at least one embodiment, the computing device 900 may include one or more processor(s) 902 (e.g., first CPU 180), one or more memory element(s) 904 (e.g., DIMMs 140), storage 906 (e.g., NVMe storage 150), a bus 908 (e.g., PCIe bus 116), one or more network processor unit(s) 910 interconnected with one or more network input/output (I/O) interface(s) 912, one or more I/O interface(s) 914 (e.g., NIC 120), and control logic 920. In various embodiments, instructions associated with logic for computing device 900 can overlap in any manner and are not limited to the specific allocation of instructions and/or operations described herein. For example, control logic 920 may embody instructions for re-timing or re-driving functionality executed by processors 510.

In at least one embodiment, processor(s) 902 is/are at least one hardware processor configured to execute various tasks, operations and/or functions for computing device 900 as described herein according to software and/or instructions configured for computing device 900. Processor(s) 902 (e.g., a hardware processor) can execute any type of instructions associated with data to achieve the operations detailed herein. In one example, processor(s) 902 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 904 and/or storage 906 is/are configured to store data, information, software, and/or instructions associated with computing device 900, and/or logic configured for memory element(s) 904 and/or storage 906. For example, any logic described herein (e.g., control logic 920) can, in various embodiments, be stored for computing device 900 using any combination of memory element(s) 904 and/or storage 906. Note that in some embodiments, storage 906 can be consolidated with memory element(s) 904 (or vice versa), or can overlap/exist in any other suitable manner.

In at least one embodiment, bus 908 can be configured as an interface that enables one or more elements of computing device 900 to communicate in order to exchange information and/or data. Bus 908 can be implemented with any architecture designed for passing control, data and/or information between processors, memory elements/storage, peripheral devices, and/or any other hardware and/or software components that may be configured for computing device 900. In at least one embodiment, bus 908 may be implemented as a fast kernel-hosted interconnect, potentially using shared memory between processes (e.g., logic), which can enable efficient communication paths between the processes.

In various embodiments, network processor unit(s) 910 may enable communication between computing device 900 and other systems, entities, etc., via network I/O interface(s) 912 to facilitate operations discussed for various embodiments described herein. In various embodiments, network processor unit(s) 910 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 900 and other systems, entities, etc. to facilitate operations for various embodiments described herein. In various embodiments, network I/O interface(s) 912 can be configured as one or more Ethernet port(s), Fibre Channel ports, and/or any other I/O port(s) now known or hereafter developed. Thus, the network processor unit(s) 810 and/or network I/O interface(s) 912 may include suitable interfaces for receiving, transmitting, and/or otherwise communicating data and/or information in a network environment.

I/O interface(s) 914 allow for input and output of data and/or information with other entities that may be connected to computer device 900. For example, I/O interface(s) 914 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 920 can include instructions that, when executed, cause processor(s) 902 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 920) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software (potentially inclusive of object code and source code), etc.) for execution by one or more processor(s), and/or other similar machine, etc. Generally, memory element(s) 904 and/or storage 906 can store data, software, code, instructions (e.g., processor instructions), logic, parameters, combinations thereof, and/or the like used for operations described herein. This includes memory element(s) 904 and/or storage 906 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi@/Wi-Fi6@), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, entities for various embodiments described herein can encompass network elements (which can include virtualized network elements, functions, etc.) such as, for example, network appliances, forwarders, routers, servers, switches, gateways, bridges, load balancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum, an apparatus is provided. The apparatus may include a motherboard; a first central processing unit socket mounted on the motherboard; a second central processing unit socket mounted on the motherboard; a first connector in communication with the first central processing unit socket; a second connector in communication with at least one input/output functional block that is disposed on the motherboard and that is configured to support a second central processing unit deployable in the second central processing unit socket; and a mezzanine printed circuit board that electrically connects the first central processing unit socket with the at least one input/output functional block via the first connector and the second connector.

In an embodiment, the mezzanine printed circuit board extends over the second central processing unit socket.

The apparatus may further include a first central processing unit disposed in the first central processing unit socket.

In an embodiment, wherein the mezzanine printed circuit board comprises a first mezzanine connector and a second mezzanine connector that correspond to and fit into, respectively, the first connector and the second connector.

The mezzanine printed circuit board may include a processor.

In an embodiment, the mezzanine printed circuit board may include a first set of electrical connections that pass directly between the first connector and the second connector, and a second set of electrical connections that pass through the processor.

In one implementation, the processor is configured to re-time or re-drive electrical signals exchanged between a first central processing unit disposed in the first central processing unit socket and the at least one input/output functional block.

The mezzanine printed circuit board may further include a switch.

The mezzanine printed circuit board may also include a cable connector in communication with the switch.

In an embodiment, the mezzanine printed circuit board electrically connects the first central processing unit socket with the at least one input/output functional block via a peripheral computer interface express (PCIe) bus.

The at least one input/output functional block may include a network interface card, an add-in card, a dual in-line memory module, a non-volatile memory express (NVMe) storage device, a host bus adaptor, and/or a hard disk drive.

In another embodiment, a method is provided. The method may include reconfiguring system interconnect links disposed between a first central processing unit socket and a second central processing unit socket, disposed together on a single motherboard, as peripheral bus links; and transmitting electrical signals, via the peripheral bus links, and via a printed circuit board that bridges the second central processing unit socket, to at least one input/output functional block that is disposed on the single motherboard and that is selectively connectable to the second central processing unit socket.

The method may also include connecting the printed circuit board to the system interconnect links via a first connector on the single motherboard and a corresponding second connector on the printed circuit board.

The printed circuit board may include a processor.

The method may also include transmitting a first portion of the electrical signals directly between the system interconnect links and the at least one input/output functional block, and transmitting a second portion of the electrical signals to the processor.

The method may still further include, using the processor, at least one of re-timing or re-driving the electrical signals.

The method may also include switching at least a portion of the electrical signals to a different path.

The method may also include transmitting the at least a portion of the electrical signals via a cable connector.

A non-transitory computer readable storage media encoded with instructions is also provided. The non-transitory computer readable storage media is encoded with instructions that, when executed by a processor, cause the processor to reconfigure system interconnect links disposed between a first central processing unit socket and a second central processing unit socket, disposed together on a single motherboard, as peripheral bus links; and transmit electrical signals, via the peripheral bus links, and via a printed circuit board that bridges the second central processing unit socket, to at least one input/output functional block that is disposed on the single motherboard and that is selectively connectable to the second central processing unit socket.

In an embodiment, the instructions, when executed by the processor, cause the processor to, at least one of, re-time or re-drive the electrical signals.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a motherboard;
    a first central processing unit socket mounted on the motherboard;
    a second central processing unit socket mounted on the motherboard;
    a first connector, separate from the first central processing unit socket and the second central processing unit socket, in communication with the first central processing unit socket;
    a second connector, separate from the first central processing unit socket and the second central processing unit socket, in communication with at least one input/output functional block that is disposed on the motherboard and that is configured to support a second central processing unit deployable in the second central processing unit socket; and
    a mezzanine printed circuit board that electrically connects the first central processing unit socket with the at least one input/output functional block via the first connector and the second connector.

2. The apparatus of claim 1, wherein the mezzanine printed circuit board extends over the second central processing unit socket.

3. The apparatus of claim 1, further comprising a first central processing unit disposed in the first central processing unit socket.

4. The apparatus of claim 1, wherein the mezzanine printed circuit board comprises a first mezzanine connector and a second mezzanine connector that correspond to and fit into, respectively, the first connector and the second connector.

5. The apparatus of claim 1, wherein the mezzanine printed circuit board comprises a processor.

6. The apparatus of claim 5, wherein the mezzanine printed circuit board comprises a first set of electrical connections that pass directly between the first connector and the second connector, and a second set of electrical connections that pass through the processor.

7. The apparatus of claim 5, wherein the processor is configured to re-time or re-drive electrical signals exchanged between a first central processing unit disposed in the first central processing unit socket and the at least one input/output functional block.

8. The apparatus of claim 5, wherein the mezzanine printed circuit board further comprises a switch.

9. The apparatus of claim 8, wherein the mezzanine printed circuit board comprises a cable connector in communication with the switch.

10. The apparatus of claim 1, wherein the mezzanine printed circuit board electrically connects the first central processing unit socket with the at least one input/output functional block via a peripheral computer interface express (PCIe) bus.

11. The apparatus of claim 1, wherein the at least one input/output functional block comprises a network interface card, an add-in card, a dual in-line memory module, a non-volatile memory express (NVMe) storage device, a host bus adaptor, and/or a hard disk drive.

12. A method comprising:
    reconfiguring system interconnect links disposed between a first central processing unit socket and a second central processing unit socket, disposed together on a single motherboard, as peripheral bus links; and
    transmitting electrical signals, via the peripheral bus links, and via a printed circuit board that physically bridges over the second central processing unit socket and that is connected to the single motherboard via connectors that are separate from the first central processing unit socket and the second central processing unit socket, to at least one input/output functional block that is disposed on the single motherboard and that is selectively connectable to the second central processing unit socket.

13. The method of claim 12, further comprising connecting the printed circuit board to the system interconnect links via a first connector on the single motherboard and a corresponding second connector on the printed circuit board.

14. The method of claim 12, wherein the printed circuit board comprises a processor.

15. The method of claim 14, further comprises transmitting a first portion of the electrical signals directly between the system interconnect links and the at least one input/output functional block, and transmitting a second portion of the electrical signals to the processor.

16. The method of claim 14, further comprising at east one of re-timing or re-driving the electrical signals.

17. The method of claim 14, further comprising switching at least a portion of the electrical signals to a different path separate from the peripheral bus links.

18. The method of claim 17, further comprising transmitting the at least a portion of the electrical signals via a cable connector.

19. A non-transitory computer readable storage media encoded with instructions that, when executed by a processor, cause the processor to:
    reconfigure system interconnect links disposed between a first central processing unit socket and a second central processing unit socket, disposed together on a single motherboard, as peripheral bus links; and
    transmit electrical signals, via the peripheral bus links, and via a printed circuit board that physically bridges over the second central processing unit socket and that is connected to the single motherboard via connectors that are separate from the first central processing unit socket and the second central processing unit socket, to at least one input/output functional block that is disposed on the single motherboard and that is selectively connectable to the second central processing unit socket.

20. The non-transitory computer readable storage media of claim 19, encoded with instructions that, when executed by the processor, cause the processor to at least one of re-time or re-drive the electrical signals.

* * * * *

UNITED STATES PATENT AND TRADEMARK OFFICE
CERTIFICATE OF CORRECTION

PATENT NO. : 11,604,755 B2
APPLICATION NO. : 17/196124
DATED : March 14, 2023
INVENTOR(S) : Jayaprakash Balachandran et al.

It is certified that error appears in the above-identified patent and that said Letters Patent is hereby corrected as shown below:

In the Claims

Claim 16, Column 12, Line 36, replace "further comprising at east" with --further comprising at least--

Signed and Sealed this
Second Day of May, 2023

Katherine Kelly Vidal
*Director of the United States Patent and Trademark Office*